United States Patent [19]
Porter

[11] Patent Number: 5,477,089
[45] Date of Patent: Dec. 19, 1995

[54] AUTOMOTIVE ELECTRONIC CONTROL SYSTEMS

[75] Inventor: Raymond S. Porter, Stourbridge, Great Britain

[73] Assignee: Grau Limited, Redditch, England

[21] Appl. No.: 53,739

[22] Filed: Apr. 27, 1993

[51] Int. Cl.⁶ .................................................. H03H 11/30
[52] U.S. Cl. ........................... 307/10.1; 333/17.3; 333/32
[58] Field of Search .............................. 333/12, 32, 17.3; 307/10.1; 455/123, 125

[56] References Cited

U.S. PATENT DOCUMENTS 5,187,454  2/1993  Collins .................................... 333/17.3

FOREIGN PATENT DOCUMENTS

0058820  9/1982  European Pat. Off. .
0155496  9/1985  European Pat. Off. .
226561  11/1986  European Pat. Off. .
1051559  12/1966  United Kingdom .
1157730  9/1969  United Kingdom .

*Primary Examiner*—Peter S. Wong
*Assistant Examiner*—Aditya Krishnan
*Attorney, Agent, or Firm*—Leydig, Voit & Mayer, Ltd.

[57] ABSTRACT

A method of increasing the immunity of an automotive electronic control system to electromagnetic interference, comprises the steps of measuring the impedance of means conducting an input to a control circuit (4) of the system, and adapting the circuit so as at least substantially to match the input impedance of the control circuit (4) in relation to that input to the measured impedance of said means (2) conducting said input. The invention also provides an automotive electronic control system comprising a control circuit (4) having its input impedance at least substantially the same as, and preferably at least substantially matched to, the impedance of means (2) conducting the relevant input to the control circuit.

17 Claims, 6 Drawing Sheets

AUTOMOTIVE ELECTRONIC CONTROL SYSTEMS

BACKGROUND OF THE INVENTION

This invention is concerned with automotive electronic control systems, and in particular with increasing the immunity of such systems to electromagnetic interference.

The term "automotive electronic control systems" as used herein includes, for example, electronically controlled braking systems (including "brake-by-wire" systems in which electrical signals produced by movement or position of a brake control element for example a brake pedal are effective to control brake operation, and/or anti-lock braking systems of electronic type), electronic engine management systems, suspension systems in which at least some suspension movement(s) or characteristic(s) is or are electronically controlled, and electronic traction control systems (in which wheelspin on low friction surfaces is prevented or reduced by electronic control of the vehicle engine and/or brakes).

Customarily such automotive electronic control systems comprise control circuits ("controllers") of electronic logic type, typically comprising microprocessors or other computing means, which provide apparatus-controlling electrical output signals in response to the level or levels of one or more electrical input signals. The input signals may be derived from a sensor which senses a relevant parameter for movement or position of a brake control element or a wheel speed sensor or an engine or transmission or ambient environment parameter or a suspension position parameter.

The operation of such controllers can, however, be particularly susceptible to spurious or inappropriate currents and voltages induced in wires carrying input and/or output signals of the controller and/or in the controller itself by unwanted radiated electromagnetic interference arising, for example, from nearby other vehicles and/or from other sources, and this susceptibility can have serious operational and safety consequences.

Because of constraints imposed by manufacturing methods and unit cost, it has not been commercially acceptable to attempt to increase the immunity of such controllers to such interference by the use of high insertion loss input filters, screened cables or enclosed metal housings.

SUMMARY OF THE INVENTION

It is an object of the invention to increase the immunity of automotive electronic control systems to electromagnetic interference.

According to a first aspect of the invention, there is provided a method of increasing the immunity of an automotive electronic control system to electromagnetic interference, comprising the steps of measuring the impedance of means conducting an input to a control circuit of the system, and adapting the circuit so as at least substantially to match the input impedance of the control circuit in relation to that input to the measured impedance of said means conducting said input.

According to a second aspect of the invention, there is provided an automotive electronic control system comprising a control circuit having its input impedance at least substantially the same as the impedance of means conducting the relevant input to the control circuit.

Preferably said input impedance has been at least substantially matched to the impedance of said means conducting the relevant input.

The susceptibility of such a controller to radiated electromagnetic interference is a function of both that electromagnetic interference which is coupled onto the electrically conductive external wiring connected to the controller, and electromagnetic interference induced into electrically conductive tracks of, for example, such printed circuit board(s) as may be present in the controller, but in the applicant's experience the majority of susceptibilities are associated with said wiring connected to the controller. The lengths of these wires are typically up to a few meters, and the range of frequency within which susceptibilities have been found to occur has been typically from about 20 MHz to about 200 MHz. The applicants have found that in this frequency range, voltage and current standing waves can be set up on the wires, due to said interference, causing an undesirable increase in unwanted induced signals presented to the controller input, which can cause incorrect and inappropriate operation of the controller, with undesirable or potentially dangerous consequences.

In relation to either the first aspect or the second aspect of the invention, in this manner the invention achieves a reduction in the establishment and magnitude of standing waves (induced by said interference) in said means (typically wiring) conducting said input, and since such standing waves are a major source of spurious inputs causing incorrect control circuit operation, the immunity of the system to such interference is thus increased.

In this manner, reliability and safety of operation of the control system may be increased.

It will be appreciated that said impedance and said input impedance are in general frequency related, and in relation to either the first aspect or the second aspect of the invention it may be arranged that those impedances are at least substantially the same for at least some frequency or frequencies within a frequency range of interest, and preferably such as to afford increased immunity over at least a significant or substantial portion of that frequency range. Thus, for example, it may be arranged to provide increased immunity over at least a substantial portion of the frequency range from about 20 MHz to about 200 MHz.

In relation to either the first aspect or the second aspect of the invention, said automotive electronic control system may comprise, for example, an electronically controlled braking system ("brake-by-wire" and/or an electronic anti-lock system) and/or an electronic engine management system and/or an electronically controlled suspension system and/or an electronic traction control system.

The vehicle braking system may comprise a primary fluid pressure supply including a fluid pressure source and a fluid pressure reservoir, a plurality of wheel brakes responsive to fluid pressure, (brake pressure), supplied thereto, a supply means comprising a supply valve for supplying brake pressure to said brakes from said primary supply in accordance with a brake operating signal, a skid control means, comprising a skid control unit for controlling the brake pressure, and an electronic controller response to wheel speed signals for sensing skid conditions of the wheels of the generating instructions for controlling said skid control unit.

The brake operating signal may comprise a fluid pressure brake operating signal generated by a brake control element.

Alternatively the brake operating signal may be an electrical signal generated by a brake control element.

Alternatively a vehicle braking system may comprise a brake control element for providing an electrical brake demand signal, an electronic controller responsive to such braking demand signal and brake valve means response to an instructing signal supplied to it by the electronic controller and arranged to control supply of fluid under pressure from a source thereof to at least one brake for brake application.

In relation to either the first aspect or the second aspect of the invention, the input(s) concerned may be, for example, from a sensor or sensors, or from a power supply.

In relation to either the first aspect or the second aspect of the invention, where the input at an input port of a control circuit is provided between a single conductive path and ground (earth), a series resistance in association with a capacitance connected between said conductive path and ground at a location intermediate said resistance and at least the majority of said control circuit, may be utilised to provide an input impedance at least substantially the same as the impedance of the means conducting the input, and where there are two inputs, provided between respective distinct current conducting paths and ground, a respective such series resistance in association with a respective such capacitance may be so provided in relation to each said current path, and preferably there is additionally provided a series combination of a further resistance and a further capacitance, said combination being connected in parallel between said conductive paths.

The invention also provides an automotive vehicle comprising an electronic control system provided or modified in accordance with the invention.

BRIEF DESCRIPTION OF THE DRAWINGS

Embodiments of the invention, and experimental data relating thereto, will now be described by way of example only, with reference to the accompanying drawings, in which.

DESCRIPTION OF THE PREFERRED EMBODIMENT

Figure 1:
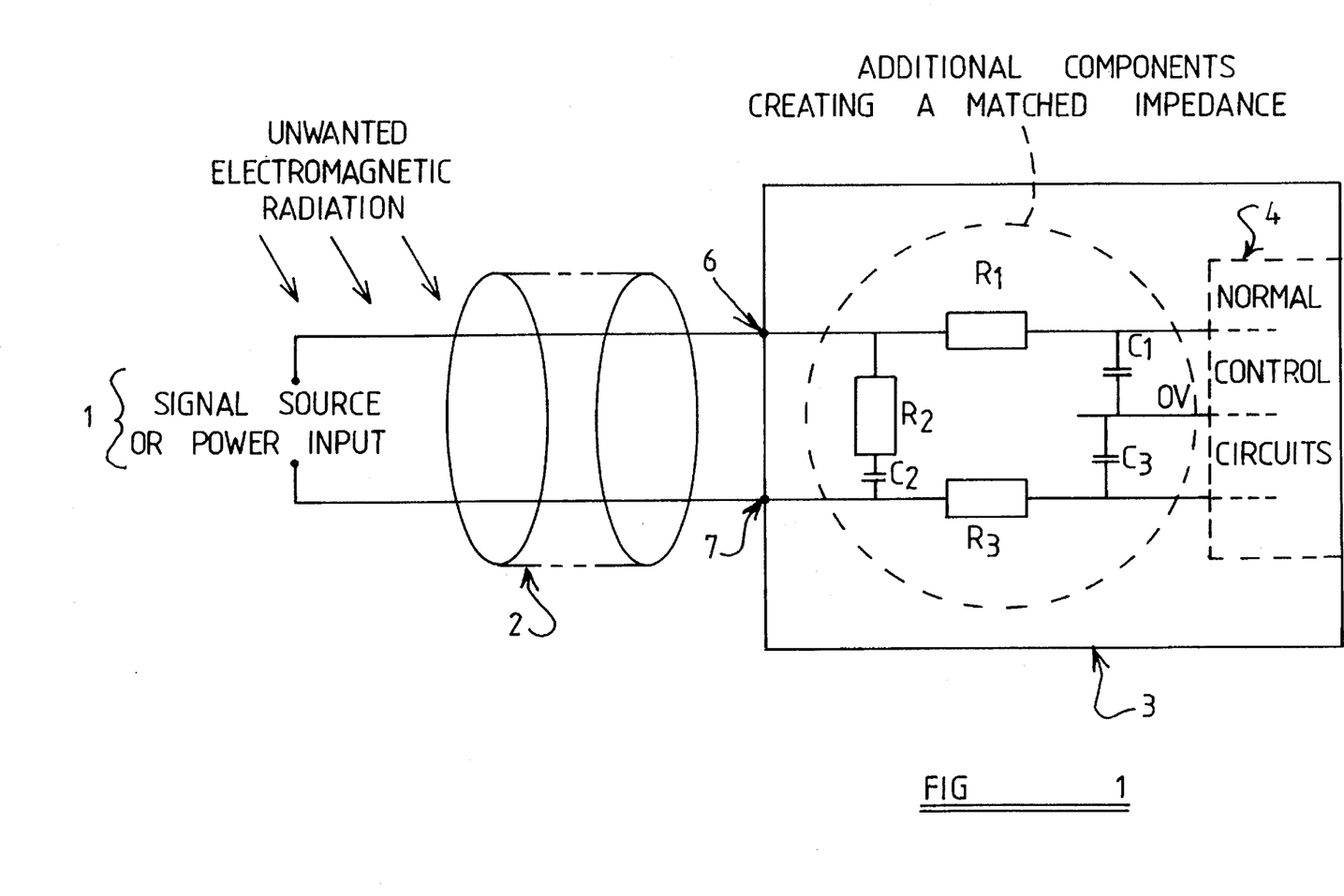
FIG. 1 illustrates a circuit modification in accordance with the invention at an input port of a control circuit of an automotive electronic control system.

Referring first to FIG. 1 of the drawings, an automotive electronic control system comprises an electronic controller 3 comprising an electrical control circuit of electronic type, which executes logic operations in response to the level or levels of one or more inputs. The controller 3 has a stimulus or power input connected to it by conducting means in the form of an electrically conductive cable 2. (Alternatively, other conducting means may be utilised if desired). The normal input circuit 4 which would exist in the controller is modified (i.e. adapted) in accordance with the present invention by incorporation of respective resistors R1, R2, and R3, and respective capacitors C1, C2, and C3 such that the impedance at high frequencies, such as for one or more frequencies in the range from about 20 MHz to about 200 MHz, looking into the controller input terminals 6 and 7 when the cable 2 is disconnected is at least substantially matched to (i.e. so as to be at least substantially the same as) that of the cable 2.

The purpose of C1, C2 and C3 is to block D.C. voltages which may be present. Their values are chosen such that at the lowest frequency at which it is desired to have good immunity, the reactance of these capacitors is negligible compared to the value of their associated resistors.

In the case of input circuits which have one side 7 connected to ground or to the controller's internal power supply, R1 and C1 will achieve the required matching. In similar manner if instead the side 6 is connected to ground or to the controller's internal power supply, R3 and C3 will achieve the required matching. Alternatively if the normal input impedance of the input circuit is very high compared to R2, the required matching may be achieved by R2 and C2 only.

In the case of input circuits of the differential type where neither terminal 6 or 7 is connected to ground or to the controller's internal power supply, all components are necessary. This is because both the differential (wire to wire) and common mode (wire to ground) impedance of the cable 2 must be matched, since the unwanted signal may be coupled into one or both of the wires in cable 2, and may be presented either between one of the input terminals 6 or 7 and ground, or between both input terminals 6 and 7. The matching of differential and common mode impedances together is achieved by the combination of R1, R2 and R3.

The above modification in accordance with the invention provides increased immunity to unwanted electromagnetic interference signals, compared with the unmodified circuit in which lack of matching between the cable impedance and the input impedance of the controller produces a voltage standing wave, at the frequency of the unwanted signal, on the cable connected to the controller, and in which peaks of this voltage standing wave may appear at the input of the controller, which will appear less immune to the unwanted signal because of the peak which occurs. Such peaks may theoretically be of an amplitude double that existing in a system correctly matched in accordance with the present invention.

Thus in a system in accordance with the present invention, voltage standing waves will be reduced to a minimum on the cable connected to the controller, therefore the unwanted signal presented to the controller input will be minimised, and the immunity to unwanted signals will be maximised.

In its broadest terms the invention is applicable to any automotive electronic control system. It may be utilised in relation to automotive electronic anti-lock braking systems, such as that illustrated in FIG. 6. This system comprises a primary fluid pressure supply including a fluid pressure source in the form of a compressor 10 and a fluid pressure reservoir 11. A plurality of wheel brakes 12 are responsive to fluid pressure (brake pressure) supplied thereto, by a supply means comprising a supply valve 13 for supplying brake pressure to said brakes 12. A skid control means is provided, comprising a skid control unit 14 for controlling the brake pressure and a controller 3 responsive to wheel speed signals for sensing skid conditions of the wheels and for generating instructions for controlling the skid control unit 14. The controller 3 is provided with at least one wheel speed signal from at least one wheel speed sensor 16 along a cable or cables 2.

Figures 6, 8:
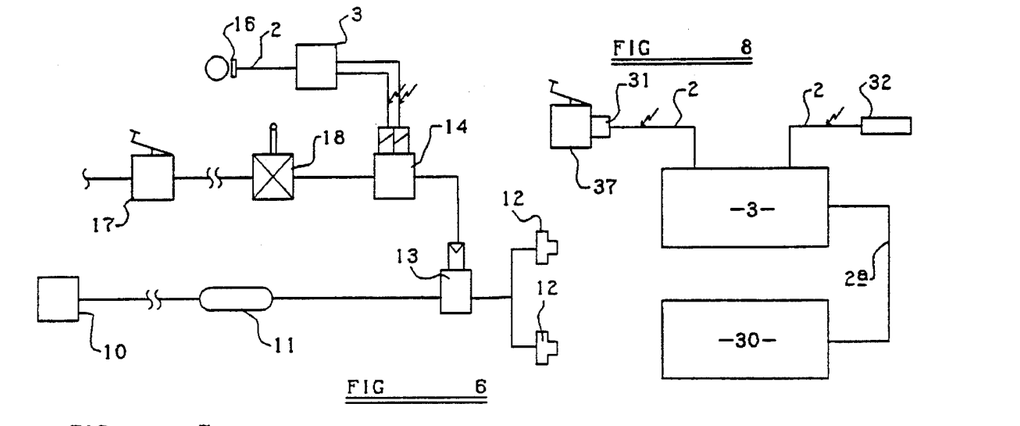
FIG. 6 illustrates a vehicle braking system embodying the invention.
FIG. 8 illustrates an electronic engine management system embodying the invention.
Figure 11:
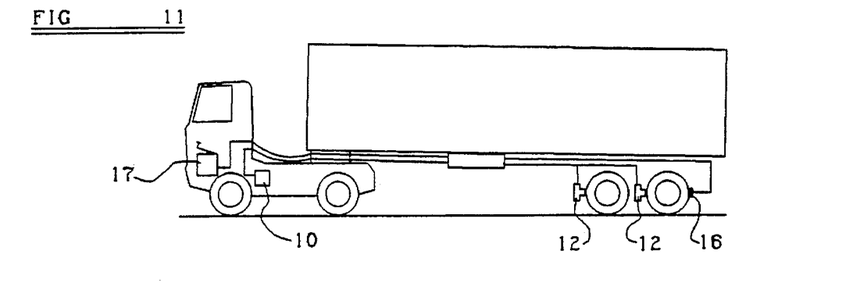
FIG. 11 is a vehicle having a braking system according to FIG. 6.

In this example the supply valve 13 is a relay valve connected in a line from a reservoir 11 to the brakes 12 and supplied with control fluid pressure by the skid control unit 14. The control pressure is provided from a brake control element 17 which in the present example comprises a brake pedal which supplies fluid pressure from a source such as the compressor 10 to the skid control unit 14 in accordance with the extent of brake application. Generally, as in the present example a load sensing valve 18 is also provided to modulate the control pressure in accordance with the loading conditions of the vehicle. If desired, the compressor 10 and the brake pedal 17 may be provided on a tractor vehicle and the other components provided on a trailer as shown in FIG. 11 as well as or instead of on the tractor vehicle.

The skid control unit 14 comprises a pair of solenoid valves which are energised by the controller 3 so as to effect one of:

a) interruption in the supply of brake pressure to the brakes 12;

b) interruption in the supply of brake pressure to the brakes 12 and exhaust of the brake pressure from the brakes 12.

Immunity to electromagnetic interference is an important safety and reliability factor, in said automotive antilock braking system but alternatively or additionally, the invention may be utilised in automotive electronically controlled braking systems generally, for example "brake-by-wire" brake systems, or in other systems such as electronic engine management systems, electronically controlled suspension systems and electronic traction control systems.

Figure 7:
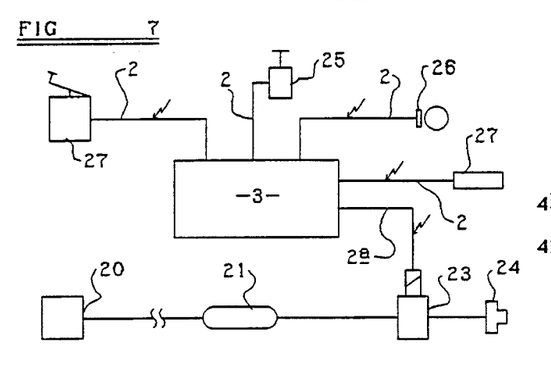
FIG. 7 illustrates another vehicle braking system embodying the invention.

An example of a "brake-by-wire" brake system is illustrated diagrammatically in FIG. 7 and comprises a primary fluid pressure supply including a fluid pressure source such as a compressor 20 and a fluid pressure reservoir 21. The system also comprises a brake control element operable by a driver of the vehicle such as a brake pedal 27 to provide an electrical braking demand signal supplied on a cable 2 to a controller 3. The controller 3 is responsive to the braking demand signal supplied on the line 2 from the brake control element 27 and supplies a controlling electrical output signal on a line 2a to a brake valve means 23 responsive to an instructing signal supplied to it on the line 2a by the controller 3 and arranged to control supply of fluid under pressure from the reservoir 21 to an actuator 24 for brake application. The controller 3 may be provided with further input signals from appropriate sensors such as the sensor 25 which provides information about the loading of the vehicle, a sensor or sensors 26 which provide :information about wheel speed to provide an anti-skid function and a sensor 27 which indicates temperature of the brakes.

A electronic engine management system is indicated generally at FIG. 8 and comprises an electronic controller 3 which provides an output signal or signals on a line or lines indicated at 2a to an engine 30 to control fuel supply and, usually, ignition timing. Suitable input parameters are provided to the controller 3 on one or more input cables 2 from appropriate sensors such as throttle position provided by a throttle position sensor 31 associated with a throttle control element 37 and engine speed provided by a sensor 32 and/or other input signals from other sensors such as at least one of, induction manifold pressure/velocity, exhaust gas analysis, e.g. $O_2$ potential, detonation, and ambient temperature.

Figure 9:
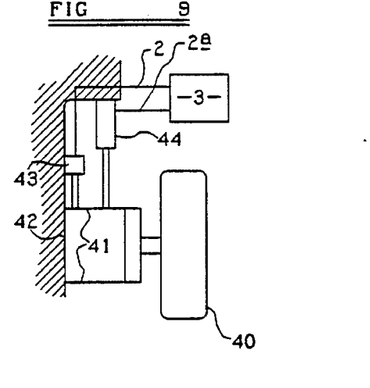
FIG. 9 illustrates an electronically controlled suspension system embodying the invention.

FIG. 9 illustrates diagrammatically an electronically controlled suspension system in which a wheel 40 is carried on suspension arms 41 from a vehicle body 42. The position and/or speed and/or rate of acceleration of a suspension member 41 is sensed by a sensor 43 and a signal indicative thereof is supplied on a cable 2 to an electronic controller 3. The controller 3 provides an output signal on a line 2a to an active suspension device 44 which controls the movement of the suspension member 41. Other inputs may be provided to the controller if desired from other sensors.

Figure 10:
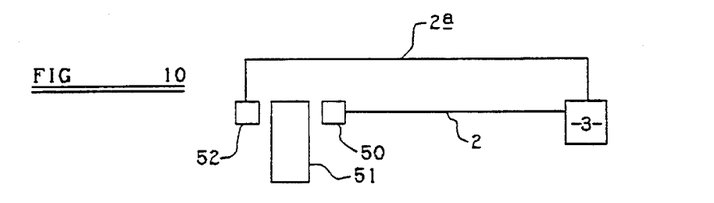
FIG. 10 illustrates an electronic traction control system embodying the invention.

An electronic traction control system is indicated generally in FIG. 10 and comprises a wheel speed sensor 50 which detects incipient spinning of a wheel 51 and provides an input signal on a cable 2 to an electronic controller 3. The controller 3 provides an output on a line 2a to a brake 52 which brakes the wheel 51 thereby counteracting the torque applied to the wheel by the engine and thus preventing skidding of the wheel. Controller 3 may be provided with other inputs on other cables 2 as desired.

In all the above described examples unwanted electromagnetic radiation impinging on the cable to and/or the controller 3 may be mitigated by providing a control system in accordance with the present invention and as described hereinbefore with reference to FIGS. 1 to 5.

Although in FIG. 1 the capacitors C1 and C3 are shown as being additional components, if such capacitors are already present as normal components for filtering, then additional such capacitors need not be provided.

The applicants have experimentally measured the changes in immunity to electromagnetic radiation interference which occurred when input ports of an automotive anti-lock electronic controller, according to FIG. 6, had had their input impedances adjusted so that they were made at least substantially equal to the respective characteristic impedances of their respective connecting cables. The effect of incorporating this matching technique was observed both when the controller was installed in a vehicle, and when the controller was a sub-system, connected simply to a small connecting harness, being tested before installation in a vehicle. A substantial increase in the field strength at which the controller became susceptible to the interference was recorded.

A sample of the relevant cable, several meters long, was driven by a rectangular pulse, and reflections of this pulse were measured at the input to the cable, and the cable characteristic impedance was taken to be equal to that resistor which, when terminating the cable, minimised the reflections. In the case of input circuits which were of a differential form, a matching network was identified which optimised both the core to core characteristic impedance and the core to ground characteristic impedance, because unwanted signals may be induced in both common mode and series mode with reference to the input.

Core to ground and core to core characteristic impedance matching are both important in relation to the present invention in order to achieve the lowest standing wave ratio (SWR).

The anti-lock controller under test used analogue interface circuitry connected to microcomputers which performed the anti-lock action. Signals going to the controller were from vehicle wheel speed signal sensors/transducers, battery power supply, and signals going from the controller were to the vehicle instrument panel anti-lock warning lamp and anti-lock valve solenoids. Warning lamp and solenoid driver stages had previously been found to be virtually unaffected by unwanted interference and so were not considered for modification in this research, but wheel speed sensor signal inputs and power supply input ports were considered highly relevant.

Figure 2:
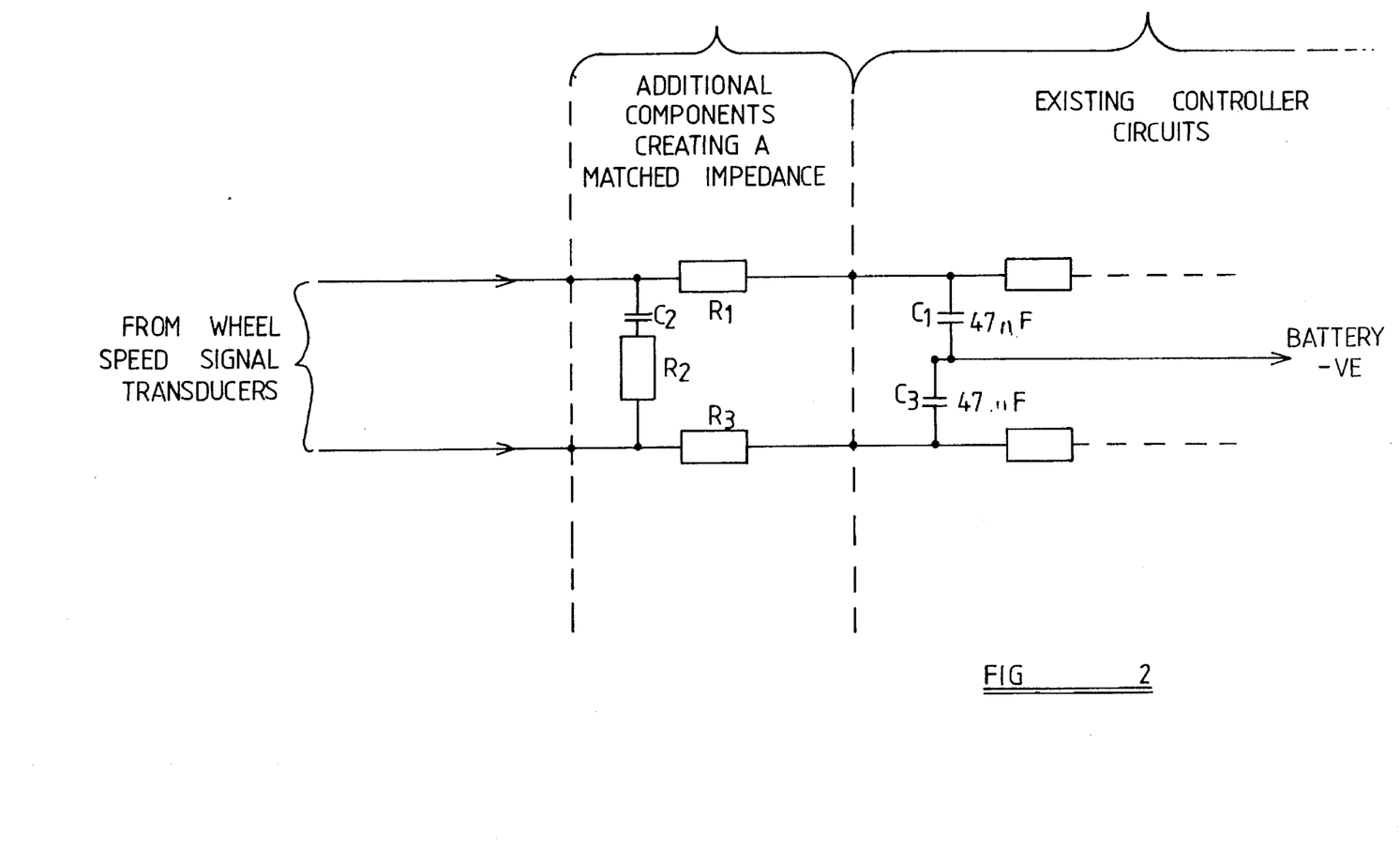
FIG. 2 illustrates a vehicle wheel speed sensor interface, of an automotive electronic control system embodying the present invention.

The wheel speed sensor input circuit and the modification which adapted its input impedance to at least substantially match that of its connecting cable is shown in FIG. 2, in which appropriate components are labelled in a manner corresponding to FIG. 1. The capacitors which originally formed part of the input circuit had had their impedances measured over the frequency range of interest and it was ascertained that it was negligible compared to the additional components used for matching. The signal sensitivity of the controller in its normal operating frequency range was decreased by less than 3 per cent because of the modifications.

Figure 3:
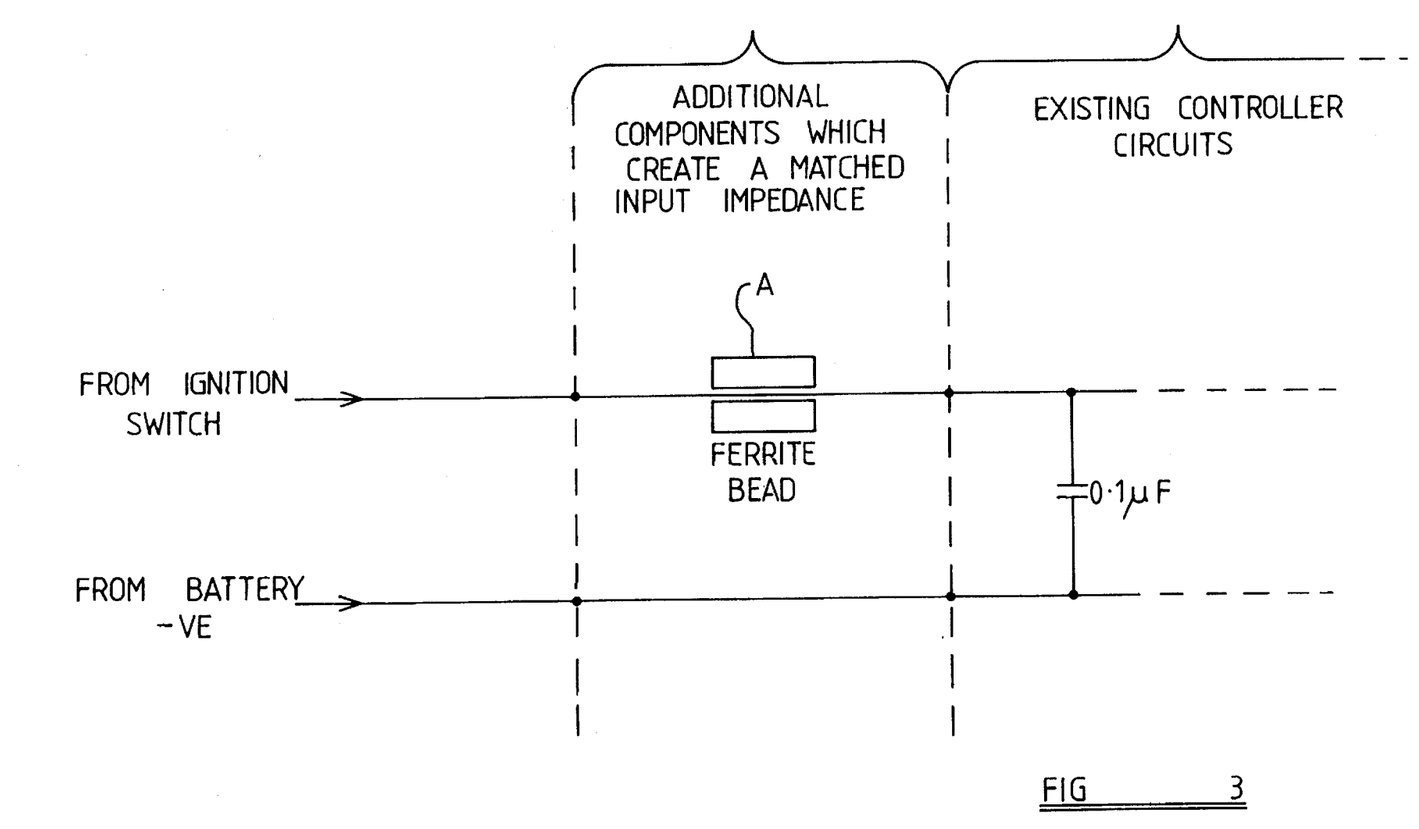
FIG. 3 illustrates a power supply input circuit, of an automotive electronic control system, embodying the present invention.

The original power supply input circuit and its modification to achieve matching is shown in FIG. 3. The original capacitor had been shown to have negligible impedance at the frequencies of interest in this research and the necessary resistive element to achieve matching was implemented by the use of a ferrite bead A (in this example Murata Manufacturing Co. Ltd. component designation BL02RN2) which had an optimum resistive component in the center of the frequency range of interest.

Figure 4:
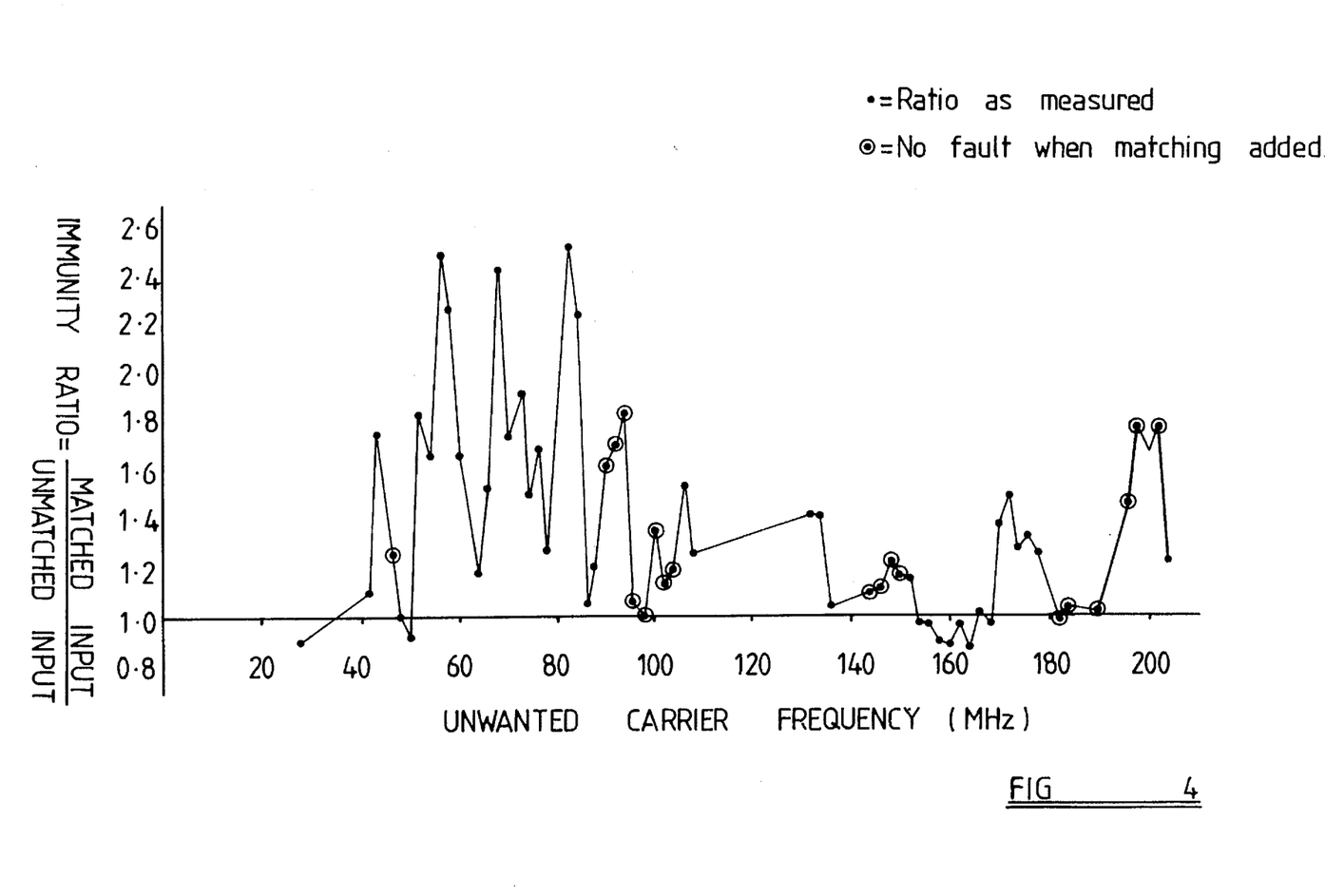
FIG. 4 illustrates experimental results showing the effect of incorporation of the present invention, in "whole vehicle" tests.

In the whole vehicle test method an articulated trailer, with the antilock controller installed, was positioned within an anechoic chamber and its wheels were exercised by a dynamometer to simulate anti-lock activity. Correct operation of the anti-lock controller was monitored by observations of the anti-lock warning lamp, anti-lock valve solenoid energisation and fault diagnostic display. The interfering radiation was produced by an antenna positioned in line with and as close as possible to the controller, but about 1 m away from the trailer. The carrier was amplitude modulated with a frequency which was equal to the wheel speed sensor output frequency at one point during the rapid deceleration of the wheels which produced the anti-lock activity. The carrier frequency was varied in discrete steps between 20 MHz and 200 MHz. At each frequency the field strength was increased until a fault signature was obtained. The profile of the susceptibility of the controller thus obtained was compared with that obtained after the matching components in accordance with the present invention were added to the same controller. 60 data points were obtained at which a fault signature could be identified in the unmatched port condition. Wheel speed sensor signal faults formed 60 per cent and power supply shutdown formed 30 per cent of these data points. When the matching components were incorporated, their effect was to reduce the number of wheel speed sensor signal faults by 30 per cent and those of power supply shutdown by 11 per cent. The relative effect of introducing matching is shown in FIG. 4. The mean field strength required to produce a fault signature was 1.48 times that required with the controller ports in their unmatched state.

Figure 5:
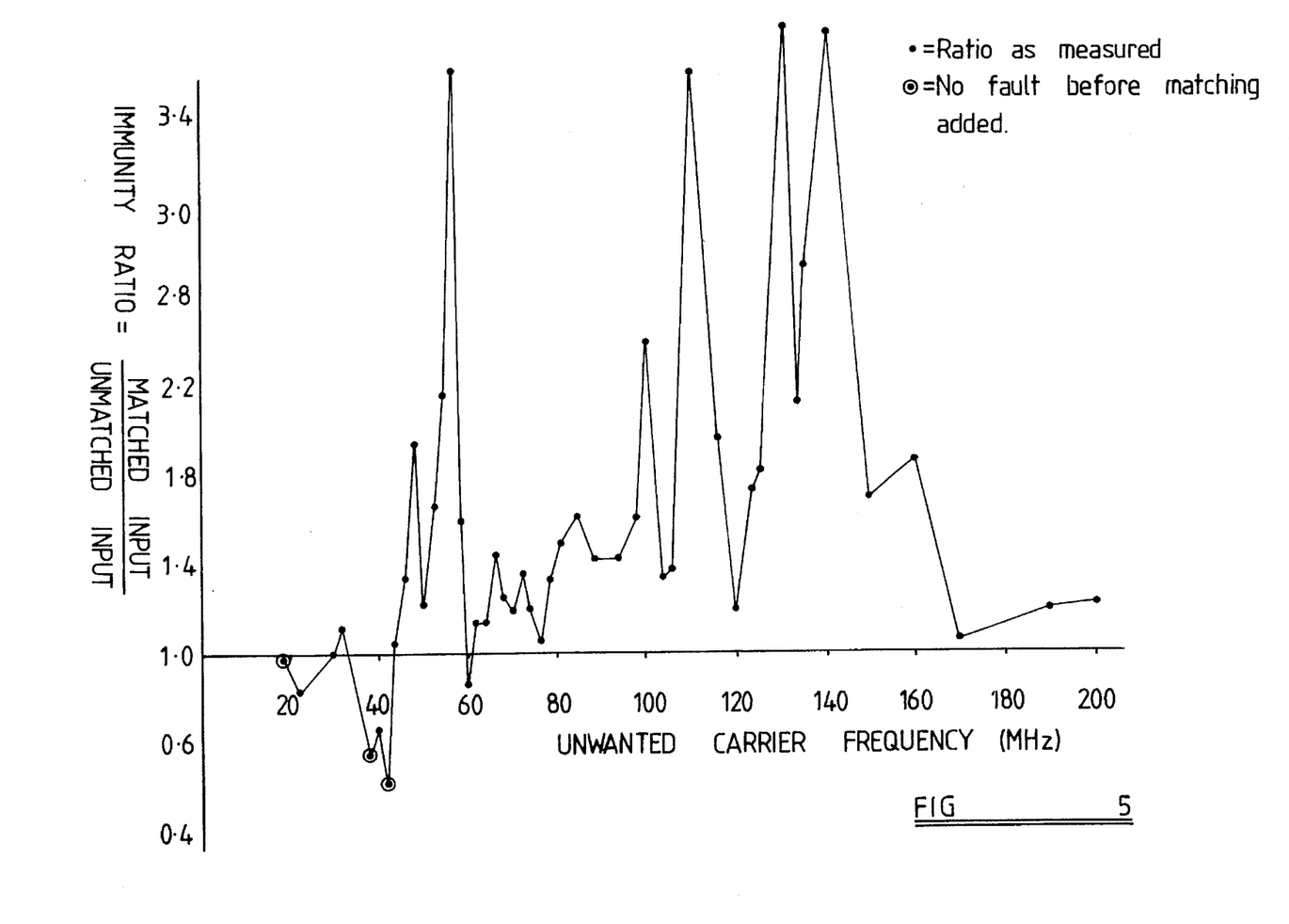
FIG. 5 illustrates experimental results showing the effect of incorporation of the present invention, in control circuit sub-system tests.

In the controller sub-system test method, the same controller was subjected to a transverse electromagnetic wave within the test volume of a "parallel plateline" similar to the type described in British Standard 6667 Part 3, 1985. A smaller connecting cable configuration was used, as in anti-lock type approval tests (directive 71/320 EEC as amended by 85/647 EEC). Valve solenoids, fault diagnostic display and anti-lock warning lamp were mounted and observed remotely from the test volume. Susceptibility profiles were then obtained for both non-matched and matched port configurations of the controller, by a similar procedure to that used in the whole vehicle test. In the unmatched condition, 79 per cent of fault signatures were associated with wheel speed sensor signals. The relative effect of introducing matching is shown in FIG. 5. The mean field strength required to produce a fault in the matched condition was 1.63 times that required in the unmatched condition. Several sets of data were taken, confirming that a real change in the controller susceptibility had been achieved when matching was applied.

Thus the matching modifications increased the level of field strength required to create these susceptibilities in both types of test. The unmatched circuit configuration presented almost a short circuit to the end of the cable at the frequencies of interest and hence there would be a standing wave current maximum in the ground plane of the input circuit printed circuit board. This would exist at all high frequencies in theory, and could be attenuated to one half of the standing wave maximum level by correct matching. This reduction in current in the input circuit ground plane and associated printed wiring tracks is believed to account for the increase in immunity which has been recorded. The addition of a series resistor also constitutes a low pass filter, which should improve immunity. However, such a filter would produce an immunity improvement which increased with frequency at the rate of 20 dB per decade. Such an improvement has not been seen, confirming that the reduction of the standing wave, in accordance with the present invention, is the reason for the observed immunity improvement.

Thus the invention provides a technique of matching the input impedance of electrical controller ports to that of the connecting cables so as to increase immunity to unwanted radiated interference over a wide frequency range. The additional components required are low in cost, suitable for automated assembly, occupy a minimum of printed circuit board area and are in general not subject to high tooling costs or single supply source restrictions.

The features disclosed in the foregoing description, or the following claims, or the accompanying drawings, expressed in their specific forms or in the terms or means for performing the desired function, or a method or process for attaining the disclosed result, may, separately or in any combination of such features, be utilised for realising the invention in diverse forms thereof.

I claim:

1. A method of increasing the immunity to electromagnetic interference of an automotive electronic control system selected from the group comprising an electronically controlled braking system, which is selected from the sub-group comprising "brake-by-wire" and an electronic anti-lock system, an electronic engine management system, an electronically controlled suspension system and an electronic traction control system, comprising the steps of measuring the impedance of at least one means conducting an input to a control circuit of the system, and adapting the control circuit to match the relevant input impedance of the control circuit to the measured impedance of said means conducting said input.

2. The method according to claim 1 wherein it is arranged that the impedance of said at least one means conducting an input is the same as the relevant input impedance of the control circuit for at least one frequency.

3. The method according to claim 2 wherein it is arranged to afford increased immunity over at least a significant or substantial portion of a frequency range.

4. The method according to claim 3 wherein it is arranged to provide increased immunity over at least a substantial portion of the frequency range from about 20 MHz to about 200 MHz.

5. The method according to claim 1 wherein the at least one input concerned is from a sensor or from a power supply.

6. The method according to claim 1 wherein where the input at an input port of a control circuit is provided between a single conductive path and ground, a series resistance in association with a capacitance connected between said conductive path and ground at a location intermediate said resistance and at least the majority of said control circuit, is utilised to provide an input impedance the same as the impedance of the means conducting the input.

7. The method according to claim 6 wherein where there are two inputs, provided between respective distinct current conducting paths and ground, a respective such series resistance in association with a respective such capacitance is so provided in relation to each said current path.

8. The method according to claim 7 wherein there is additionally provided a series combination of a further resistance and a further capacitance, said combination being connected in parallel between said conductive paths.

9. An automotive electronic control system selected from the group comprising an electronically controlled braking system, which is selected from the sub-group comprising "brake-by-wire" and an electronic anti-lock system, an electronic engine management system, an electronically controlled suspension system and an electronic traction control system comprising a control circuit having at least one input impedance the same as the impedance of means conducting the relevant input to the control circuit.

10. An automotive electronic control system according to claim 9 wherein said at least one input impedance has been matched to the impedance of said means conducting the relevant input.

11. An automotive electronic control system according to claim 10 wherein it is arranged that at least one input impedance is the same as the impedance of the means conducting the relevant input to the control circuit for at least one frequency.

12. An automotive electronic control system according to claim 11 arranged to afford increased immunity over at least a significant or substantial portion of a frequency range.

13. An automotive electronic control system according to claim 12 arranged to provide increased immunity over at least a substantial portion of the frequency range from about 20 MHz to about 200 MHz.

14. An automotive electronic control system according to claim 9 wherein the at least one input concerned is or are from a sensor, or from a power supply.

15. An automotive electronic control system according to claim 9 wherein the input at an input port of a control circuit is provided between a single conductive path and ground, a series resistance in association with a capacitance connected between said conductive path and ground at a location intermediate said resistance and at least the majority of said control circuit is utilised to provide an input impedance the same as the impedance of the means conducting the input.

16. An automotive electronic control system according to claim 15 wherein, where there are two inputs, provided between respective distinct current conducting paths and ground, a respective such series resistance in association with a respective such capacitance is so provided in relation to each said current path.

17. An automotive electronic control system according to claim 16 wherein there is additionally provided a series combination of a further resistance and a further capacitance, said combination being connected in parallel between said conductive paths.

* * * * *